(12) United States Patent
Zeltser

(10) Patent No.: US 8,218,271 B2
(45) Date of Patent: Jul. 10, 2012

(54) TMR SENSOR WITH A MULTILAYERED REFERENCE LAYER

(75) Inventor: Alexander M. Zeltser, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 433 days.

(21) Appl. No.: 12/507,618

(22) Filed: Jul. 22, 2009

(65) Prior Publication Data

US 2011/0020668 A1    Jan. 27, 2011

(51) Int. Cl.
*G11B 5/33* (2006.01)
(52) U.S. Cl. ...................................... 360/324.2
(58) Field of Classification Search ............... 360/324.2, 360/324.11, 324.12; 29/603.03, 603.04, 29/603.12, 603.16
See application file for complete search history.

(56) References Cited

U.S. PATENT DOCUMENTS

| | | | | |
|---|---|---|---|---|
| 6,262,869 | B1 * | 7/2001 | Lin et al. ................. | 360/324.11 |
| 6,327,122 | B1 | 12/2001 | Pinarbasi ................. | 360/324.11 |
| 6,519,121 | B1 | 2/2003 | Gill ........................ | 360/324.11 |
| 6,525,911 | B1 | 2/2003 | Gill ........................ | 360/319 |
| 6,600,638 | B2 | 7/2003 | Gill ........................ | 360/324.11 |
| 6,713,195 | B2 | 3/2004 | Wang et al. ............. | 428/692 |
| 6,723,457 | B2 | 4/2004 | Tanahashi et al. ...... | 428/694 |
| 6,731,477 | B2 * | 5/2004 | Lin et al. ................ | 360/324.1 |
| 6,818,458 | B1 | 11/2004 | Gill ........................ | 438/3 |
| 6,891,703 | B2 | 5/2005 | Hasegawa ............... | 360/324.11 |
| 7,001,680 | B2 | 2/2006 | Gill ........................ | 428/811.1 |
| 7,041,205 | B2 | 5/2006 | Rou et al. ............... | 204/298.13 |
| 7,067,331 | B2 | 6/2006 | Slaughter et al. ...... | 438/3 |
| 7,102,854 | B2 * | 9/2006 | Wang et al. ............. | 360/125.5 |
| 7,149,045 | B1 * | 12/2006 | Mallary et al. .......... | 360/55 |
| 7,227,728 | B2 * | 6/2007 | Lin ......................... | 360/324.1 |
| 7,242,556 | B2 * | 7/2007 | Gill ........................ | 360/324.12 |
| 7,345,854 | B2 * | 3/2008 | Takano ................... | 360/324.12 |
| 7,461,933 | B2 * | 12/2008 | Deily et al. ............. | 347/102 |
| 7,486,475 | B2 * | 2/2009 | Biskeborn .............. | 360/121 |
| 7,633,724 | B2 * | 12/2009 | Gill ........................ | 360/324.2 |
| 7,679,862 | B2 * | 3/2010 | Nakamoto et al. ..... | 360/125.32 |
| 7,751,156 | B2 * | 7/2010 | Mauri et al. ............ | 360/324.2 |
| 7,796,364 | B2 * | 9/2010 | Lin ......................... | 360/324.11 |
| 7,830,641 | B2 * | 11/2010 | Lin ......................... | 360/324.2 |
| 7,900,342 | B2 * | 3/2011 | Freitag et al. .......... | 29/603.18 |
| 8,094,421 | B2 * | 1/2012 | Lin ......................... | 360/324.2 |
| 2004/0041183 | A1 | 3/2004 | Slaughter et al. ...... | 257/295 |
| 2007/0217088 | A1 | 9/2007 | Freitag et al. .......... | 360/324.12 |
| 2007/0230068 | A1 * | 10/2007 | Gill ........................ | 360/324.2 |
| 2008/0023740 | A1 | 1/2008 | Horng et al. ........... | 257/295 |
| 2008/0080101 | A1 * | 4/2008 | Mauri et al. ............ | 360/324.2 |
| 2008/0144234 | A1 | 6/2008 | Lin ......................... | 360/324.11 |
| 2008/0204945 | A1 * | 8/2008 | Freitag et al. .......... | 360/324.11 |
| 2008/0259507 | A1 * | 10/2008 | Lin ......................... | 360/324.1 |
| 2009/0168267 | A1 * | 7/2009 | Lin ......................... | 360/324.2 |
| 2009/0323228 | A1 * | 12/2009 | Carey et al. ............ | 360/319 |
| 2012/0040089 | A1 * | 2/2012 | Lin ......................... | 427/131 |

* cited by examiner

*Primary Examiner* — Allen Cao
(74) *Attorney, Agent, or Firm* — Zilka-Kotab, PC

(57) ABSTRACT

According to one embodiment, a method for forming at least a portion of a magnetic head includes forming a keeper layer, forming a reference layer, and forming an AFM coupling layer which is positioned between the keeper layer and the reference layer. In addition, forming the reference layer includes forming a layer of CoFe, depositing a layer of CoFeHf which is about 20 atomic % Hf, and depositing a layer of CoFeB such that the layers of CoFeHf and CoFeB are directly adjacent and a ratio of respective physical thicknesses of CoFeHf to CoFeB is less than about 0.66. Other embodiments are also included such as a magnetic head and additional methods for forming at least a portion of a magnetic head.

22 Claims, 7 Drawing Sheets

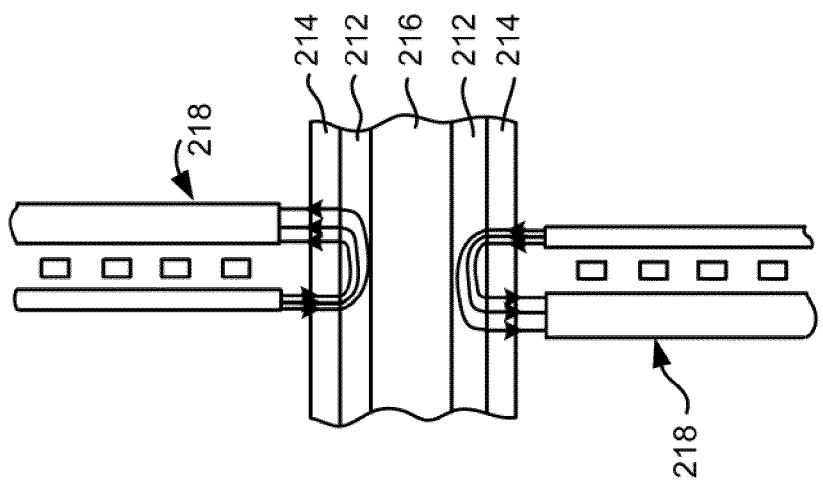
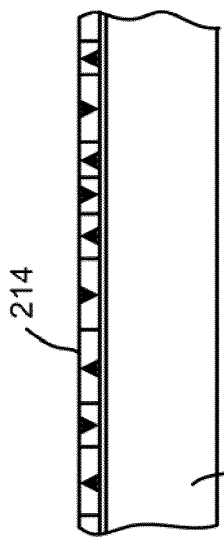
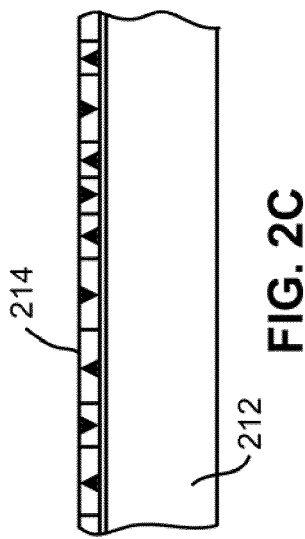
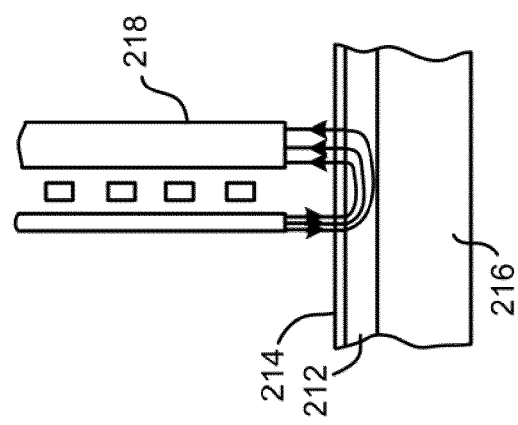
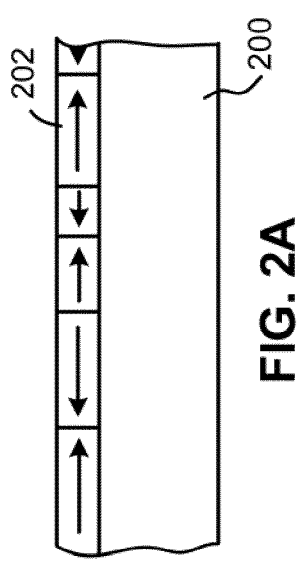
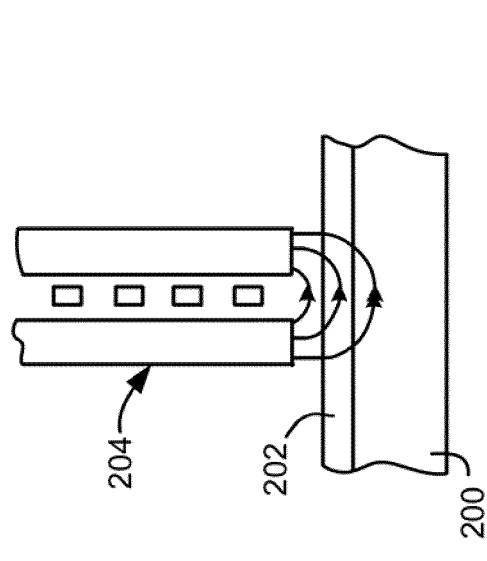

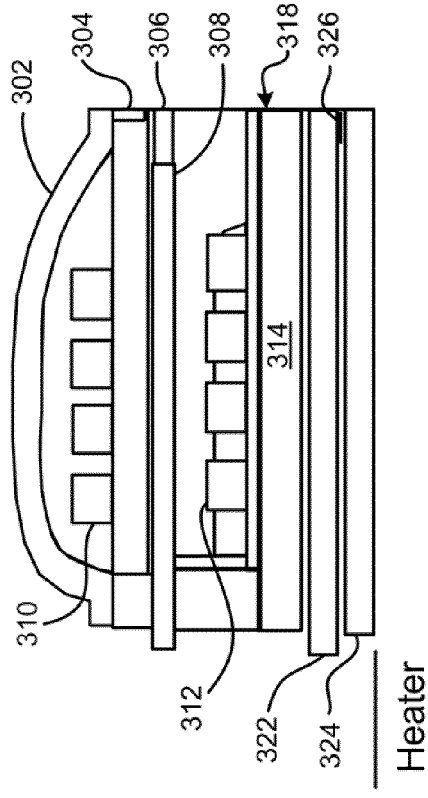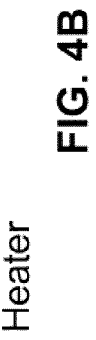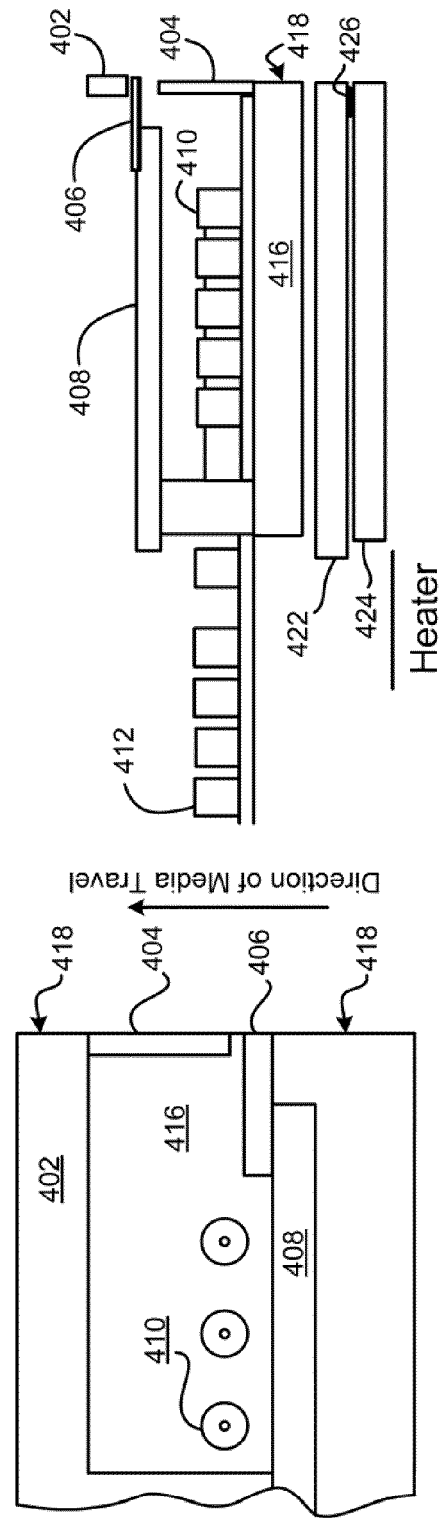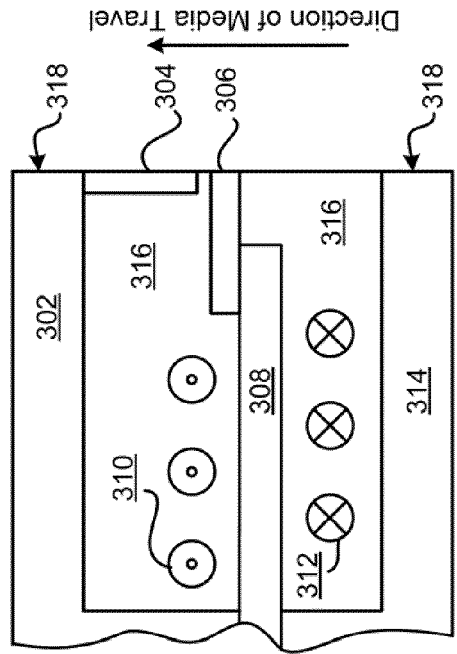

TMR SENSOR WITH A MULTILAYERED REFERENCE LAYER

FIELD OF THE INVENTION

The present invention relates to magnetic sensors, and more particularly, this invention relates to systems and methods of making and using a tunneling magnetoresistive head with a multilayered reference layer.

BACKGROUND OF THE INVENTION

The heart of a computer is a magnetic disk drive which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

There are many different types of read and/or write magnetic heads used in magnetic disk systems. One such type of read/write head is a tunneling magnetoresistive (TMR) head. One drawback with using a typical TMR head is that there is a weak antiferromagnetic (AFM) coupling between the reference layer and keeper layer through the antiferromagnetic (AFM) coupling layer, where this AFM coupling is referred to as AFM coupling field $HeP_2$. Previous attempts to increase $HeP_2$ have resulted in undesirable side effects. For example, an increase in the AFM coupling between the reference layer and the keeper layer can cause an increase in the ferromagnetic coupling between the reference layer and the free layer which degrades the performance of the TMR head. In another example, tunneling magnetoresistance can decrease when the AFM coupling between the reference layer and the keeper layer increases.

Therefore, it would be beneficial to have a TMR head with increased AFM coupling between the reference layer and the keeper layer without substantially increasing the ferromagnetic coupling between the reference layer and the free layer and without substantially decreasing the tunneling magnetoresistance of the head.

SUMMARY OF THE INVENTION

According to one embodiment, a method for forming at least a portion of a magnetic head includes forming a keeper layer, forming a reference layer, and forming an AFM coupling layer which is positioned between the keeper layer and the reference layer. In addition, forming the reference layer includes forming a layer of CoFe, depositing a layer of CoFeHf which is about 20 atomic % Hf, and depositing a layer of CoFeB such that the layers of CoFeHf and CoFeB are directly adjacent.

A method for forming at least a portion of a magnetic head, according to another embodiment, includes forming a keeper layer, forming a reference layer, and forming an AFM coupling layer which is positioned between the keeper layer and the reference layer. Forming the reference layer includes forming a layer of CoFe, depositing a layer of CoFeHf by co-sputtering CoFe and Hf or by sputtering from a CoFeHf target, and depositing a layer of CoFeB by sputtering. The layers of CoFeHf and CoFeB are directly adjacent, and a ratio of respective physical thicknesses of CoFeHf to CoFeB is less than about 0.66.

In another embodiment, a magnetic head includes a keeper layer, an AFM coupling layer adjacent the keeper layer, a reference layer on an opposite side of the AFM coupling layer than the keeper layer, a free magnetic layer, and a dielectric tunnel junction layer between the free magnetic layer and the reference layer. The layer of CoFeHf is about 20 atomic % Hf, and the reference layer includes a layer of CoFe, and a layer of CoFeHf directly adjacent the layer of CoFeB.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 2A.

FIG. 2C is a magnetic recording medium utilizing a perpendicular recording format.

FIG. 2D is a schematic representation of a recording head and recording medium combination for perpendicular recording on one side.

FIG. 2E is a schematic representation of a recording apparatus adapted for recording separately on both sides of the medium.

FIG. 3A is a cross-sectional view of one particular embodiment of a perpendicular magnetic head with helical coils.

FIG. 3B is a cross-sectional view of one particular embodiment of a piggyback magnetic head with helical coils.

FIG. 4A is a cross-sectional view of one particular embodiment of a perpendicular magnetic head with looped coils.

FIG. 4B is a cross-sectional view of one particular embodiment of a piggyback magnetic head with looped coils.

DETAILED DESCRIPTION

The following description is made for the purpose of illustrating the general principles of the present invention and is not meant to limit the inventive concepts claimed herein.

Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods, as well as operation and/or component parts thereof.

In one general embodiment, a method for forming at least a portion of a magnetic head comprises forming a keeper layer; forming a reference layer; forming an AFM coupling layer, the AFM coupling layer being positioned between the keeper and reference layers; and wherein forming the reference layer includes forming a layer of CoFe; depositing a layer of CoFeHf, wherein the layer of CoFeHf is about 20 atomic % Hf; and depositing a layer of CoFeB, wherein the layers of CoFeHf and CoFeB are directly adjacent.

In another general embodiment, a method for forming at least a portion of a magnetic head comprises forming a keeper layer; forming a reference layer; forming an AFM coupling layer, the AFM coupling layer being positioned between the keeper and reference layers; and wherein forming the reference layer includes forming a layer of CoFe; depositing a layer of CoFeHf; and depositing a layer of CoFeB, wherein the layers of CoFeHf and CoFeB are directly adjacent, wherein depositing the layer of CoFeHf is performed by co-sputtering CoFe and Hf or sputtering from a CoFeHf target, wherein depositing the layer of CoFeB is performed by sputtering, wherein a ratio of respective physical thicknesses of CoFeHf to CoFeB is less than about 0.66.

In yet another general embodiment, a magnetic head comprises a keeper layer; an AFM coupling layer adjacent the keeper layer; and a reference layer on an opposite side of the AFM coupling layer than the keeper layer, the reference layer further comprising: a layer of CoFe; a layer of CoFeHf; and a layer of CoFeB, wherein the layers of CoFeHf and CoFeB are directly adjacent; a free magnetic layer; and a dielectric tunnel junction layer between the free magnetic layer and the reference layer, wherein the layer of CoFeHf is about 20 atomic % Hf.

Figure 1:
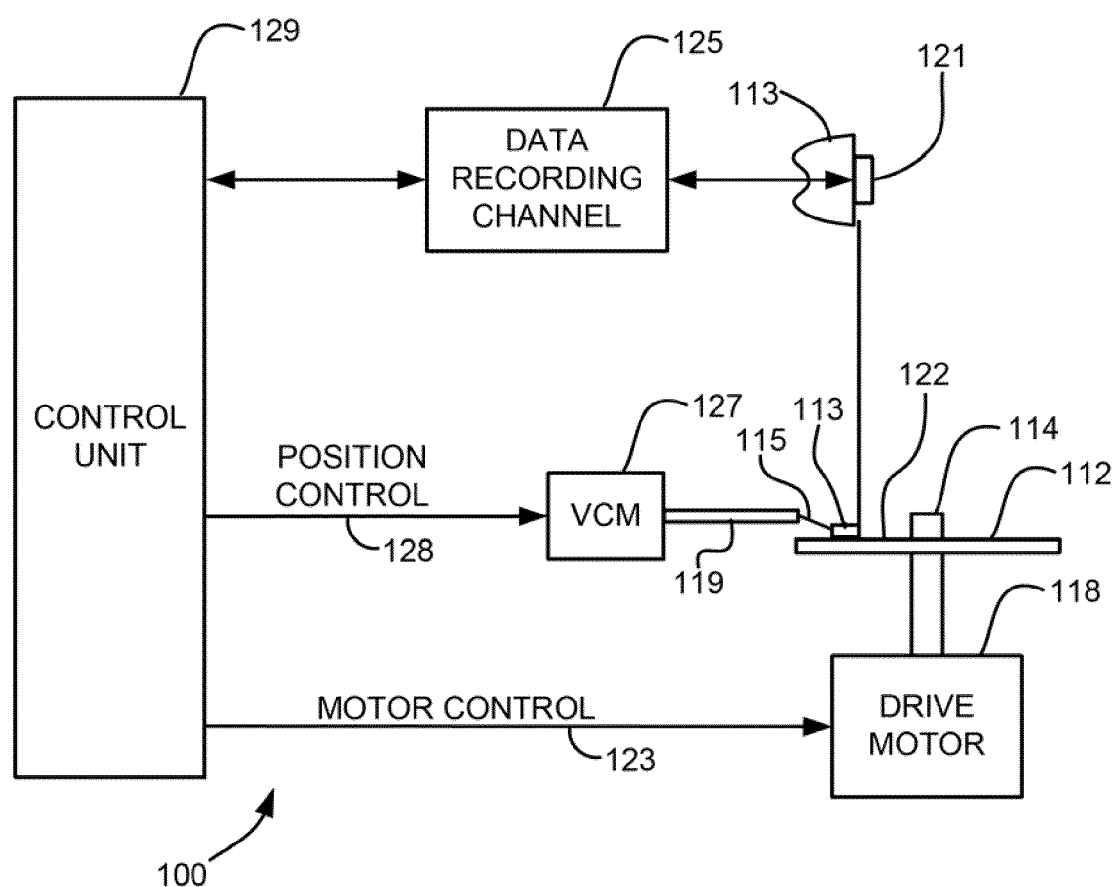
FIG. 1 is a simplified drawing of a magnetic recording disk drive system.

Referring now to FIG. 1, there is shown a disk drive 100 in accordance with one embodiment of the present invention. As shown in FIG. 1, at least one rotatable magnetic disk 112 is supported on a spindle 114 and rotated by a disk drive motor 118. The magnetic recording on each disk is typically in the form of an annular pattern of concentric data tracks (not shown) on the disk 112.

At least one slider 113 is positioned near the disk 112, each slider 113 supporting one or more magnetic read/write heads 121. As the disk rotates, slider 113 is moved radially in and out over disk surface 122 so that heads 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by control unit 129, such as access control signals and internal clock signals. Typically, control unit 129 comprises logic control circuits, storage (e.g., memory), and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical Magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write head includes a coil layer embedded in one or more insulation layers (insulation stack), the insulation stack being located between first and second pole piece layers. A gap is formed between the first and second pole piece layers by a gap layer at an air bearing surface (ABS) of the write head. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in circular tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

FIG. 2A illustrates, schematically, a conventional recording medium such as used with magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a recording/playback head 204, which may preferably be a thin film head, and a conventional recording medium, such as that of FIG. 2A.

FIG. 2C illustrates, schematically, the orientation of magnetic impulses substantially perpendicular to the surface of a recording medium as used with magnetic disc recording systems, such as that shown in FIG. 1. For such perpendicular recording the medium typically includes an under layer 212 of a material having a high magnetic permeability. This under layer 212 is then provided with an overlying coating 214 of magnetic material preferably having a high coercivity relative to the under layer 212.

FIG. 2D illustrates the operative relationship between a perpendicular head 218 and a recording medium. The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

In this structure, the magnetic lines of flux extending between the poles of the perpendicular head 218 loop into and out of the overlying coating 214 of the recording medium with the high permeability under layer 212 of the recording medium causing the lines of flux to pass through the overlying coating 214 in a direction generally perpendicular to the surface of the medium to record information in the overlying coating 214 of magnetic material preferably having a high coercivity relative to the under layer 212 in the form of magnetic impulses having their axes of magnetization substantially perpendicular to the surface of the medium. The flux is channeled by the soft underlying coating 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium, allowing for recording on each side of the medium.

FIG. 3A is a cross-sectional view of a perpendicular magnetic head. In FIG. 3A, helical coils 310 and 312 are used to create magnetic flux in the stitch pole 308, which then delivers that flux to the main pole 306. Coils 310 indicate coils extending out from the page, while coils 312 indicate coils extending into the page. Stitch pole 308 may be recessed from the ABS 318. Insulation 316 surrounds the coils and may provide support for some of the elements. The direction of the media travel, as indicated by the arrow to the right of the structure, moves the media past the lower return pole 314 first, then past the stitch pole 308, main pole 306, trailing shield 304 which may be connected to the wrap around shield (not shown), and finally past the upper return pole 302. Each of these components may have a portion in contact with the ABS 318. The ABS 318 is indicated across the right side of the structure.

Perpendicular writing is achieved by forcing flux through the stitch pole 308 into the main pole 306 and then to the surface of the disk positioned towards the ABS 318.

FIG. 3B illustrates a piggyback magnetic head having similar features to the head of FIG. 3A. Two shields 304, 314 flank the stitch pole 308 and main pole 306. Also sensor shields 322, 324 are shown. The sensor 326 is typically positioned between the sensor shields 322, 324.

FIG. 4A is a schematic diagram of one embodiment which uses looped coils 410, sometimes referred to as a pancake configuration, to provide flux to the stitch pole 408. The stitch pole then provides this flux to the main pole 406. In this orientation, the lower return pole is optional. Insulation 416 surrounds the coils 410, and may provide support for the stitch pole 408 and main pole 406. The stitch pole may be recessed from the ABS 418. The direction of the media travel, as indicated by the arrow to the right of the structure, moves the media past the stitch pole 408, main pole 406, trailing shield 404 which may be connected to the wrap around shield (not shown), and finally past the upper return pole 402 (all of which may or may not have a portion in contact with the ABS 418). The ABS 418 is indicated across the right side of the structure. The trailing shield 404 may be in contact with the main pole 406 in some embodiments.

FIG. 4B illustrates another type of piggyback magnetic head having similar features to the head of FIG. 4A including a helical coil 410, which wraps around to form helical coil 412. Also, sensor shields 422, 424 are shown. The sensor 426 is typically positioned between the sensor shields 422, 424.

In FIGS. 3B and 4B, an optional heater is shown near the non-ABS side of the magnetic head. A heater (Heater) may also be included in the magnetic heads shown in FIGS. 3A and 4A. The position of this heater may vary based on design parameters such as where the protrusion is desired, coefficients of thermal expansion of the surrounding layers, etc.

Figure 5:
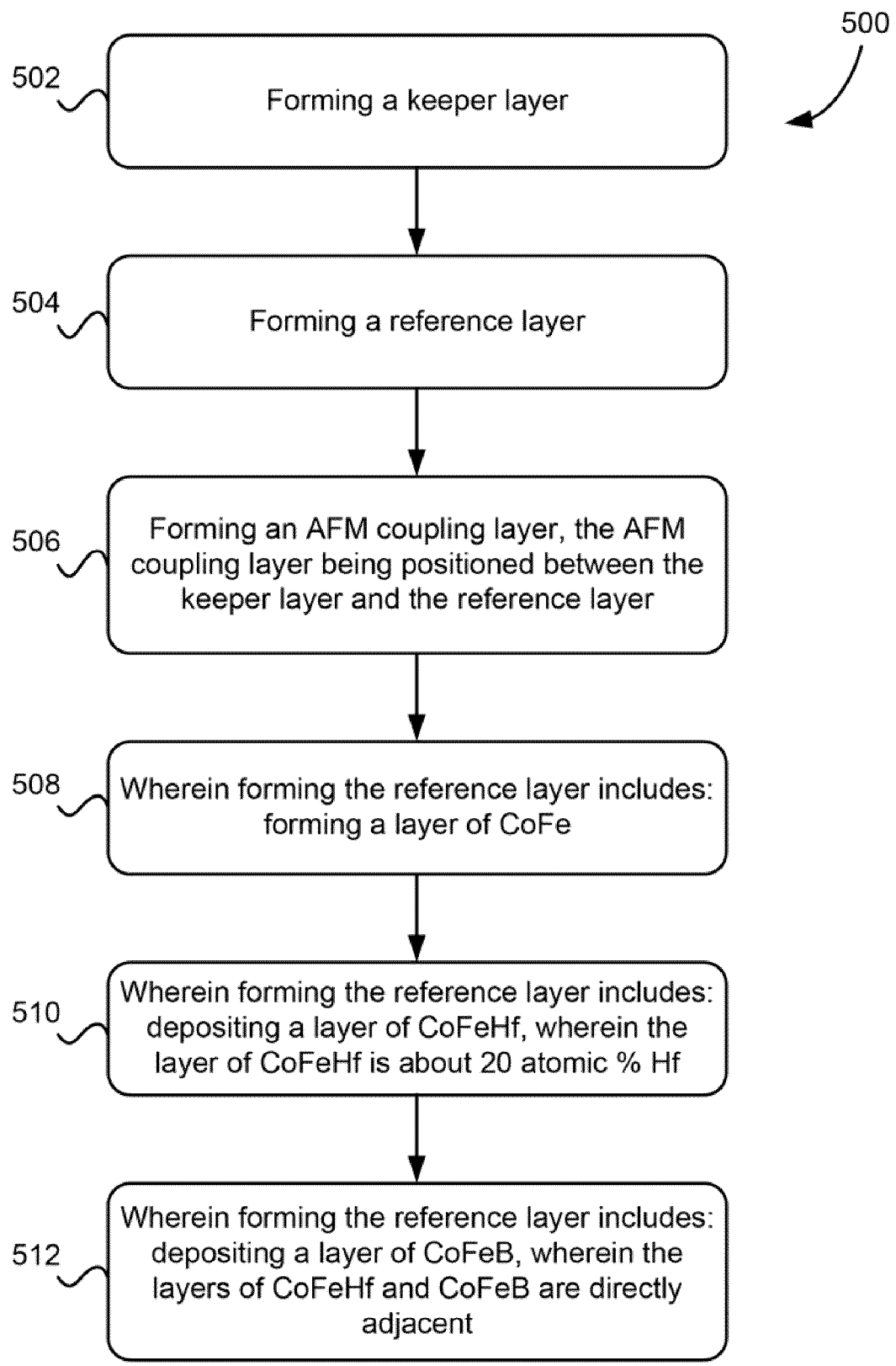
FIG. 5 is a flowchart of a method for forming at least a portion of a magnetic head according to one embodiment.

According to some embodiments and with reference to FIG. 5, a method 500 is described for forming at least a portion of a magnetic head. The method 500 may be performed in any desired environment, and operations may be added to those described below according to conditions, materials, time, and/or processing changes. Moreover, while illustrative processing techniques may be provided herein, any suitable processing techniques known in the art may be used.

In operation 502, a keeper layer is formed. For example, the keeper layer may be similar to that shown in FIG. 7, keeper layer 702. The keeper layer may be comprised of any ferromagnetic material, such as Co, Co—Fe, etc., and combinations thereof. In some preferred embodiments, the keeper layer may be comprised of $CoFe_{25}$.

In some more embodiments, the keeper layer may be comprised of more than one material. Also, the keeper layer may be formed in more than one layer, of the same or different materials, with the same or different formation techniques, such as physical vapor deposition (PVD) including sputtering, evaporation, etc.

Referring again to FIG. 5, in operation 504, a reference layer is formed. For example, the reference layer may be similar to that shown in FIG. 7, reference layer 704. The reference layer may be comprised of any ferromagnetic material, such as Co—Fe, Co—Fe—B, etc., and combinations thereof.

Figure 7:
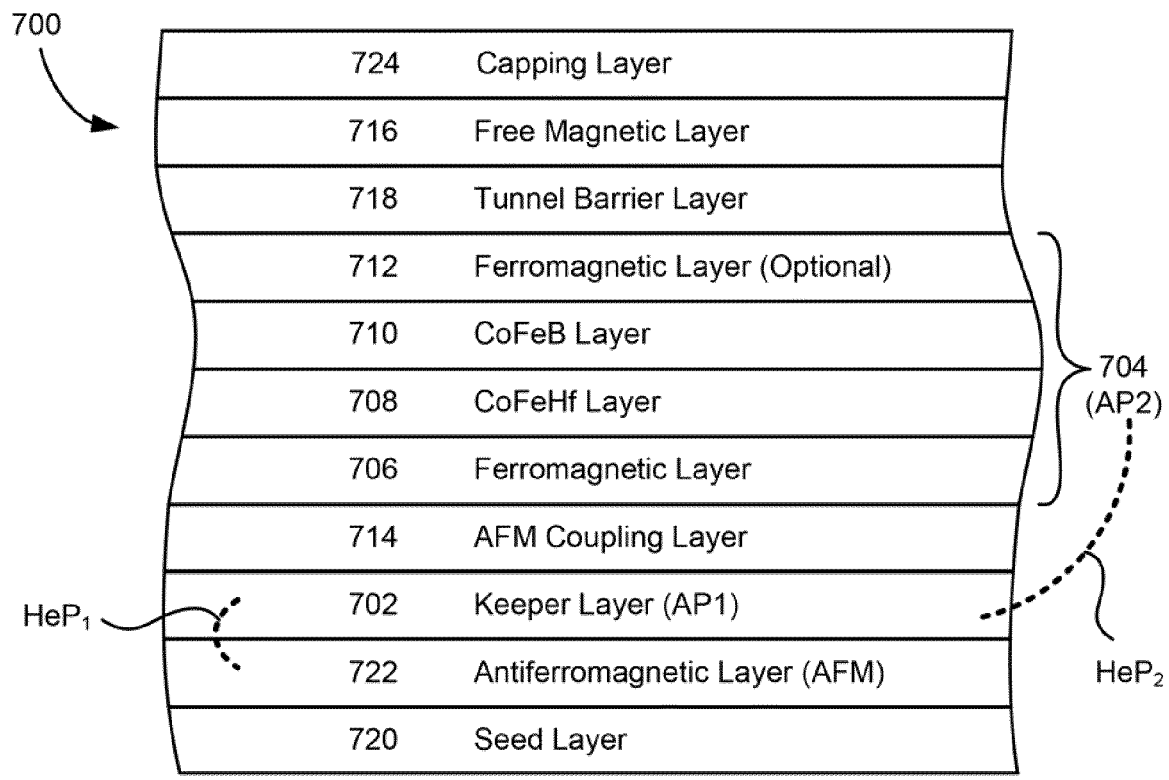
FIG. 7 is a simplified schematic of a portion of a magnetic head according to one embodiment.

In some preferred embodiments, the reference layer is comprised of more than one layer. For example, as shown in FIG. 7, the reference layer 704 is comprised of four layers, a first CoFe layer 706 which may be comprised of $CoFe_{25}$; a CoFeHf layer 708 which may be comprised of $CoFe_9Hf_{25}$; a CoFeB layer 710 which may be comprised of $CoFe_{34}B_{15}$; and a second CoFe layer 712 which may be comprised of $CoFe_{25}$. The layers which comprise the reference layer 704 may be oriented with layer 708 above layer 706, layer 710 above layer 708, and layer 712 above layer 710.

Referring again to FIG. 5, in operation 506, an AFM coupling layer is formed. As shown in FIG. 7, the AFM coupling layer 714 is positioned between the keeper layer 702 and the reference layer 704. The AFM coupling layer may be comprised of any AFM coupling material, such as Ru, Ir, Rh, Cr, Cu, Hf, etc., and combinations thereof.

According to a preferred embodiment, in operation 508 of FIG. 5, forming the reference layer includes forming a layer of CoFe. The layer of CoFe may have any percentage of Co as compared to Fe. For example, it may be one to one, two to one, three to one, etc.

Also, in operation 510, forming the reference layer includes depositing a layer of CoFeHf, wherein the layer of CoFeHf is about 20 atomic % Hf. ("about" 20 atomic % Hf includes 20 atomic % Hf±2 atomic % Hf). For example, the layer of CoFeHf may comprise $CoFe_{9.8}Hf_{20}$.

In some embodiments, the layer of CoFeHf may be deposited by co-sputtering CoFe and Hf, wherein a Hf and a CoFe deposition power are each selected and used to provide an AFM coupling field $HeP_2$ of the reference layer and the keeper layer of greater than about 3500 Oe (where about 3500 Oe includes 3500 Oe±250 Oe). Those skilled in the art will appreciate how to vary the sputtering powers to achieve deposits having different properties. Moreover, standard tests may be used to determine the HeP2 of the resultant deposit when practicing the teachings set forth herein. Through a process of iteration, one skilled in the art can readily achieve the embodiments disclosed herein without undue experimentation. Similar results can be achieved by using a CoFeHf target of appropriate composition. More detail of what $HeP_2$ describes is included in the description of FIG. 8, included below.

In more embodiments, depositing the layer of CoFeHf may be performed by co-sputtering CoFe and Hf, wherein a Hf and a CoFe deposition power are each selected and used to provide an exchange pinning field $HeP_1$ of the keeper layer and an antiferromagnetic layer of greater than about 5900 Oe (where about 5900 Oe includes 5900 Oe±250 Oe). Similar results can be achieved by using a CoFeHf target of appropriate composition. More detail of what $HeP_1$ describes is included in the description of FIG. 8, included below.

In addition, in operation 512 of FIG. 5, forming the reference layer includes depositing a layer of CoFeB, wherein the layers of CoFeHf and CoFeB are directly adjacent, as shown in FIG. 7 as layers 708 and 710.

In certain embodiments, depositing the layer of CoFeHf may be performed by co-sputtering CoFe and Hf, and depositing the layer of CoFeB may be performed by sputtering, wherein a ratio of respective physical thicknesses of CoFeHf to CoFeB is less than about 0.66 and greater than 0, e.g., less than 0.66±0.066. Similar results can be achieved by using a CoFeHf target of appropriate composition. In addition, the ratio of respective physical thicknesses of CoFeHf to CoFeB may preferably be between about 0.66 and about 0.2, alternatively between about 0.33 and about 0.2, alternatively in one example about 0.22.

In further embodiments, the ratio of respective physical thicknesses of CoFeHf to CoFeB may be less than about 0.33 and greater than 0.

Figure 6:
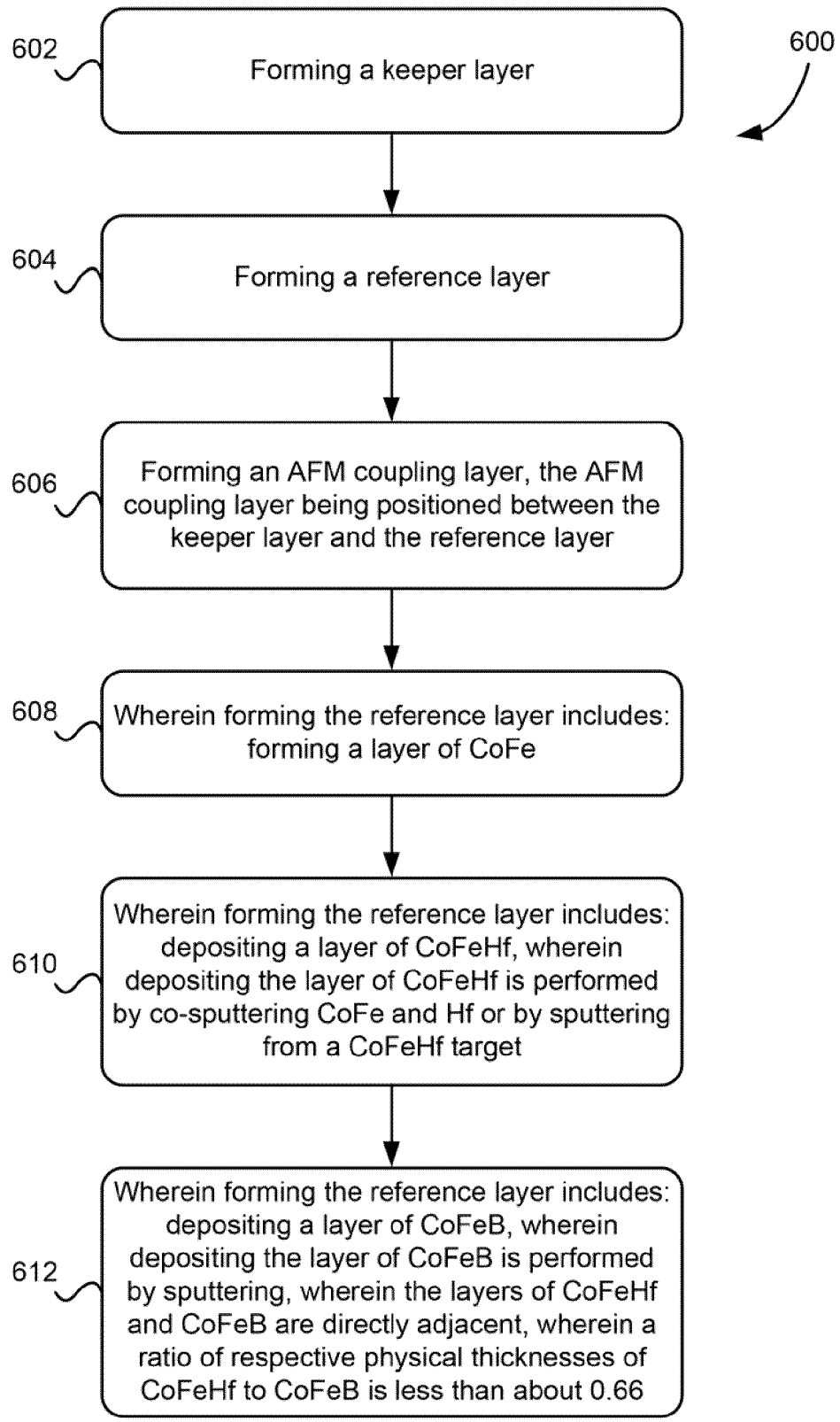
FIG. 6 is a flowchart of a method for forming at least a portion of a magnetic head according to one embodiment.

Now referring to FIG. 6, a method 600 for forming at least a portion of a magnetic head is described. The method may be performed in any desired environment, and may use intermediate process operations not described herein, but which may be known to one of ordinary skill in the relevant art.

In operation 602, a keeper layer is formed. For example, the keeper layer may be similar to that shown in FIG. 7, keeper layer 702. The keeper layer may be comprised of any ferromagnetic material, such as Co, Co—Fe, etc., and combinations thereof. In some preferred embodiments, the keeper layer may be comprised of $CoFe_{25}$.

In some more embodiments, the keeper layer may be comprised of more than one material. Also, the keeper layer may be formed in more than one layer, of the same or different materials, with the same or different formation techniques, such as physical vapor deposition (PVD), including sputtering, evaporation, etc.

Referring again to FIG. 6, in operation 604, a reference layer is formed. For example, the reference layer may be similar to that shown in FIG. 7, reference layer 704. The reference layer may be comprised of any ferromagnetic material, such as Co—Fe, Co—Fe—B, etc., and/or combinations thereof.

In some preferred embodiments, the reference layer is comprised of more than one layer. For example, as shown in FIG. 7, the reference layer 704 is comprised of four layers, a first CoFe layer 706 which may be comprised of $CoFe_{25}$; a CoFeHf layer 708 which may be comprised of $CoFe_9Hf_{25}$; a CoFeB layer 710 which may be comprised of $CoFe_{34}B_{15}$; and a second CoFe layer 712 which may be comprised of $CoFe_{25}$. The layers which comprise the reference layer 704 may be oriented with layer 708 above layer 706, layer 710 above layer 708, and layer 712 above layer 710.

Referring again to FIG. 6, in operation 606, an AFM coupling layer is formed. As shown in FIG. 7, the AFM coupling layer 714 is positioned between the keeper layer 702 and the reference layer 704. The AFM coupling layer may be comprised of any AFM coupling material, such as Ru, Ir, Rh, Cr, Cu, Hf, etc., and combinations thereof.

According to a preferred embodiment, in operation 608 of FIG. 6, forming the reference layer includes forming a layer of CoFe.

Also, in operation 610 of FIG. 6, forming the reference layer includes depositing a layer of CoFeHf, wherein depositing the layer of CoFeHf is performed by co-sputtering CoFe and Hf, or by using a CoFeHf target of appropriate composition.

In addition, in operation 612 of FIG. 6, forming the reference layer includes depositing a layer of CoFeB, wherein depositing the layer of CoFeB is performed by sputtering. Also, the layers of CoFeHf and CoFeB are directly adjacent, and a ratio of respective physical thicknesses of CoFeHf to CoFeB is less than about 0.66 and greater than 0, e.g., less than 0.66±0.066. In some preferred embodiments, the ratio of respective physical thicknesses of CoFeHf to CoFeB may be between about 0.66 and about 0.2, and in one approach the ratio of respective physical thicknesses of CoFeHf to CoFeB may be between about 0.33 and about 0.2. In one example, the ratio of respective physical thicknesses of CoFeHf to CoFeB may be about 0.22.

According to some approaches, depositing the layer of CoFeHf may be performed by co-sputtering CoFe and Hf, wherein a Hf and a CoFe deposition power are each selected and used to provide a $HeP_2$ of the reference layer and the keeper layer of greater than about 3500 Oe (where about 3500 Oe includes 3500 Oe±250 Oe). Similar results can be achieved by using a CoFeHf target of appropriate composition. More detail of what $HeP_2$ describes is included in the description of FIG. 8, included below.

In some embodiments, depositing the layer of CoFeHf may be performed by co-sputtering CoFe and Hf, wherein a Hf and a CoFe deposition power are each selected and used to provide a $HeP_1$ of the keeper layer and an antiferromagnetic layer of greater than about 5900 Oe (where about 5900 Oe includes 5900 Oe±250 Oe). Similar results can be achieved by using a CoFeHf target of appropriate composition. More detail of what $HeP_1$ describes is included in the description of FIG. 8, included below.

According to more embodiments, the ratio of respective physical thicknesses of CoFeHf to CoFeB may be less than about 0.33 and greater than 0. In a more preferable approach, the ratio of respective deposition times of CoFeHf to CoFeB may be about 0.22 and greater than 0.

In a preferred embodiment, the layer of CoFeHf may be about 20 atomic % Hf. ("about" 20 atomic % Hf includes 20 atomic % Hf±2 atomic % Hf). For example, the layer of CoFeHf may comprise $CoFe_{9.8}Hf_{20}$.

Now referring to FIG. 7, a portion of a magnetic head 700 is described according to one embodiment. The portion of the magnetic head 700 comprises a keeper layer 702 and an AFM coupling layer 714 adjacent the keeper layer 702. Also, the portion of the magnetic head 700 includes a reference layer 704 on an opposite side of the AFM coupling layer 714 than the keeper layer 702. The reference layer 704 comprises a layer of CoFe 706, a layer of CoFeHf 708, and a layer of CoFeB 710, wherein the layer of CoFeHf 708 and the layer of CoFeB 710 are directly adjacent. The portion of the magnetic head 700 also includes a free magnetic layer 716 and a dielectric tunnel barrier layer 718 (tunnel junction layer) between the free magnetic layer 716 and the reference layer 704. The layer of CoFeHf is about 20 atomic % Hf (where "about" in an atomic % context denotes±2 atomic %). For example, the layer of CoFeHf may comprise $CoFe_{9.8}Hf_{20}$.

In some embodiments, the portion of the magnetic head 700 may include additional layers, such as a seed layer 720, an antiferromagnetic layer (AFM) 722 below the keeper layer (API) 702, and a capping layer 724 above the free magnetic layer 716. Other layers may be included as well, such as shields, insulating layers, etc.

Also indicated in FIG. 7 is $HeP_1$ and $HeP_2$, which denote the magnetic field between the keeper layer 702 and the AFM 722, and the magnetic field between the reference layer 704 and the keeper layer 702, respectively. $HeP_1$ and $HeP_2$ are typically measured in Oe, and they are typically used to denote the coupling strength of the magnetic field between the respective layers. It is desirable to increase the strength of $HeP_2$ without sacrificing any other beneficial characteristics of the portion of the magnetic head 700, such as the coupling between the reference layer 704 and the free layer 716, the strength of $HeP_1$, the strength of the exchange coupling field (Hex) between the AFM layer 722 and the keeper layer 702, etc.

In reference to the thickness of each layer shown in FIG. 7, each layer is shown with the same thickness for simplicity. In implementation, each layer may have a thickness as determined by design considerations of the magnetic head, and may or may not be similar in thickness to one another.

By forming a portion of a magnetic head using the methods disclosed herein, such as using a 20 atomic % Hf in the layer of CoFeHf 708, and keeping the ratio of CoFeHf to CoFeB thicknesses in the reference layer 704 to about 0.22, it has surprisingly been found that the strength of $HeP_2$ is increased by at least about 20% over prior art magnetic heads without substantially sacrificing any other desirable characteristics of the magnetic head 700, according to preferred embodiments. Also, by forming a portion of a magnetic head using the methods disclosed herein, another beneficial effect that was surprisingly found was an increase in the strength of $HeP_1$ by about 10% over prior art magnetic heads. In addition, similar and/or the same values were discovered for the tunneling magnetoresistance of the magnetic head (TMR), the tunneling magnetoresistance of the magnetic head compared to resistance through an area of the sensor stack of the magnetic head (TMR/RA), and Hex.

The AFM coupling layer 714 may be comprised of any AFM coupling material, according to some embodiments, such as Ru, Ir, Rh, Cr, Cu, Hf, etc., and combinations thereof.

According to some embodiments, a ratio of respective physical thicknesses of CoFeHf to CoFeB may be less than about 0.66 and greater than 0. Preferably, the ratio of respective physical thicknesses of CoFeHf to CoFeB may be between about 0.66 and about 0.15, and in one approach the ratio of respective physical thicknesses of CoFeHf to CoFeB may be between about 0.33 and about 0.20. According to one example, the ratio of respective physical thicknesses of CoFeHf to CoFeB may be about 0.22.

In some embodiments, a $HeP_2$ of the reference layer 704 and the keeper layer 702 may be greater than about 3500 Oe (where about 3500 Oe includes 3500 Oe±250 Oe).

In even more embodiments, a $HeP_1$ of the keeper layer 702 and an antiferromagnetic layer may be greater than about 5900 Oe (where about 5900 Oe includes 5900 Oe±250 Oe).

Figure 8:
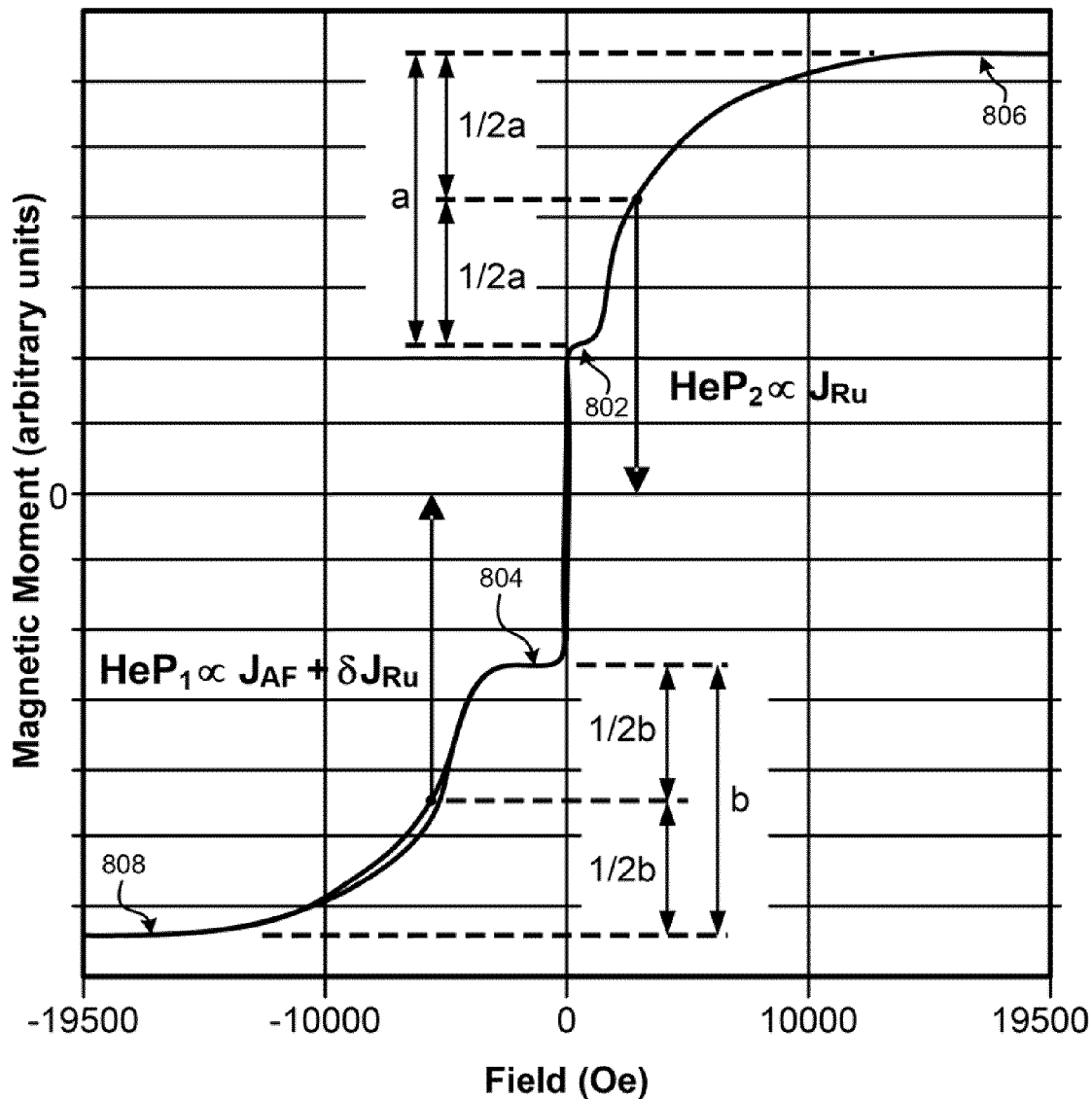
FIG. 8 is a M-H loop or plot of magnetic moment versus applied magnetic field of a TMR sensor.

Now referring to FIG. 8, a more detailed description of $HeP_1$ and $HeP_2$ may be made. In FIG. 8, $J_{Ru}$ represents the strength of the antiferromagnetic (AFM) coupling between the keeper layer, such as keeper layer 702 in FIG. 7, and the reference layer, such as reference layer 704 in FIG. 7, of a TMR sensor. Referring again to FIG. 8, $J_{AF}$ represents the strength of exchange coupling between the keeper layer, such as keeper layer 702 in FIG. 7, and the AFM layer, such as AFM layer 722 in FIG. 7, of a TMR sensor. Referring again to FIG. 8, $\delta J_{Ru}$ represents the increase in strength of exchange coupling ($J_{AF}$) between the keeper layer, such as keeper layer 702 in FIG. 7, and the AFM layer, such as AFM layer 722 in FIG. 7, of a TMR sensor, that comes from the increase in $J_{Ru}$. $HeP_2$ can be measured by determining the upper saturation point 806 and the upper inflection point 802 of the measured magnetic moment of a TMR sensor. Measuring the distance a between these points, then dividing by half (½a) results in the starting point for measuring $HeP_2$ down to a magnetic moment of zero. $HeP_1$ can be measured by determining the lower saturation point 808 and the lower inflection point 804, then measuring the distance b between these points. Half of distance b indicates the starting point for $HeP_1$, measured up to a magnetic moment of zero. Therefore, as can be seen from these descriptions and in reference to FIG. 8, $HeP_1$ is proportional to the sum of $J_{AF}$ and $\delta J_{Ru}$. Also, $HeP_2$ is proportional to $J_{Ru}$.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A method for forming at least a portion of a magnetic head, the method comprising:
   forming a keeper layer;
   forming a reference layer;
   forming an AFM coupling layer, the AFM coupling layer being positioned between the keeper layer and the reference layer; and
   wherein forming the reference layer includes:
      forming a layer of CoFe;
      depositing a layer of CoFeHf, wherein the layer of CoFeHf is about 20 atomic % Hf;
      depositing a layer of CoFeB, wherein the layers of CoFeHf and CoFeB are directly adjacent; and
      depositing a second layer of CoFe above the layers of CoFeHf and CoFeB.

2. The method as recited in claim 1, wherein depositing the layer of CoFeHf is performed by co-sputtering CoFe and Hf, wherein a Hf and a CoFe deposition power are each selected and used to provide a $HeP_2$ of the reference and keeper layers of greater than about 3500 Oe.

3. The method as recited in claim 1, wherein depositing the layer of CoFeHf is performed by sputtering from a CoFeHf target, wherein the CoFeHf target provides a $HeP_2$ of the reference layer and keeper layer of greater than about 3500 Oe.

4. The method as recited in claim 1, wherein depositing the layer of CoFeHf is performed by co-sputtering CoFe and Hf, wherein a Hf and a CoFe deposition power are each selected and used to provide a $HeP_1$ of the keeper layer and an antiferromagnetic layer of greater than about 5900 Oe.

5. The method as recited in claim 1, wherein depositing the layer of CoFeHf is performed by sputtering from a CoFeHf target, wherein the CoFeHf target provides a $HeP_1$ of the keeper layer and an antiferromagnetic layer of greater than about 5900 Oe.

6. The method as recited in claim 1, wherein depositing the layer of CoFeHf is performed by co-sputtering CoFe and Hf, wherein depositing the layer of CoFeB is performed by sputtering, wherein a ratio of respective physical thicknesses of CoFeHf to CoFeB is less than about 0.66.

7. The method as recited in claim 6, wherein the ratio of respective physical thicknesses of CoFeHf to CoFeB is less than about 0.33.

8. The method as recited in claim 1, wherein depositing the layer of CoFeHf is performed by sputtering using a CoFeHf target, wherein depositing the layer of CoFeB is performed by sputtering, wherein a ratio of respective physical thicknesses of CoFeHf to CoFeB is less than about 0.66.

9. The method as recited in claim 8, wherein the ratio of respective physical thicknesses of CoFeHf to CoFeB is less than about 0.33.

10. The method as recited in claim 1, wherein a ratio of respective physical thicknesses of CoFeHf to CoFeB is greater than 0 and less than or about 0.22.

11. A method for forming at least a portion of a magnetic head, the method comprising:
    forming a keeper layer;
    forming a reference layer;
    forming an AFM coupling layer, the AFM coupling layer being positioned between the keeper and reference layers; and
    wherein forming the reference layer includes:
        forming a layer of CoFe;
        depositing a layer of CoFeHf, wherein depositing the layer of CoFeHf is performed by co-sputtering CoFe and Hf or by sputtering from a CoFeHf target; and
        depositing a layer of CoFeB, wherein depositing the layer of CoFeB is performed by sputtering,
        wherein the layers of CoFeHf and CoFeB are directly adjacent, and wherein a ratio of respective physical thicknesses of CoFeHf to CoFeB is less than about 0.22 and greater than 0.

12. The method as recited in claim 11, wherein depositing the layer of CoFeHf is performed by co-sputtering CoFe and Hf, wherein a Hf and a CoFe deposition power are each selected and used to provide a $HeP_2$ of the reference and keeper layers of greater than about 3500 Oe.

13. The method as recited in claim 11, wherein depositing the layer of CoFeHf is performed by sputtering from a CoFeHf target, wherein the CoFeHf target provides a $HeP_2$ of the reference and keeper layers of greater than about 3500 Oe.

14. The method as recited in claim 11, wherein depositing the layer of CoFeHf is performed by co-sputtering CoFe and Hf, wherein a Hf and a CoFe deposition power are each selected and used to provide a $HeP_1$ of the keeper layer and an antiferromagnetic layer of greater than about 5900 Oe.

15. The method as recited in claim 11, wherein depositing the layer of CoFeHf is performed by sputtering from a CoFeHf target, wherein the CoFeHf target provides a $HeP_1$ of the keeper layer and an antiferromagnetic layer of greater than about 5900 Oe.

16. The method as recited in claim 11, further comprising forming a ferromagnetic layer above the layer of CoFeB and below a dielectric tunnel junction layer.

17. The method as recited in claim 11, wherein a ratio of respective deposition times of CoFeHf to CoFeB is about 0.22 or less and greater than 0.

18. The method as recited in claim 11, wherein the layer of CoFeHf is about 20 atomic % Hf.

19. A magnetic head, comprising:
    a keeper layer;
    an AFM coupling layer adjacent the keeper layer;
    a reference layer on an opposite side of the AFM coupling layer than the keeper layer, the reference layer further comprising:
        a layer of CoFe;
        a layer of CoFeHf; and
        a layer of CoFeB, wherein the layers of CoFeHf and CoFeB are directly adjacent;
    a free magnetic layer; and
    a dielectric tunnel junction layer between the free magnetic layer and the reference layer,
    wherein the layer of CoFeHf is about 20 atomic % Hf, and
    wherein a ratio of respective physical thicknesses of CoFeHf to CoFeB is less than about 0.22 and greater than 0.

20. The magnetic head as recited in claim 19, further comprising an antiferromagnetic layer positioned below the keeper layer, wherein a $HeP_2$ of the reference and keeper layers is greater than about 3500 Oe, and wherein a $HeP_1$ of the keeper layer and the antiferromagnetic layer is greater than about 5900 Oe.

21. The magnetic head as recited in claim 19, wherein a $HeP_2$ of the reference and keeper layers is greater than about 3500 Oe.

22. The magnetic head as recited in claim 19, wherein a $HeP_1$ of the keeper layer and an antiferromagnetic layer is greater than about 5900 Oe.

* * * * *

UNITED STATES PATENT AND TRADEMARK OFFICE
CERTIFICATE OF CORRECTION

| | |
|---|---|
| PATENT NO. | : 8,218,271 B2 |
| APPLICATION NO. | : 12/507618 |
| DATED | : July 10, 2012 |
| INVENTOR(S) | : Alexander M. Zeltser |

It is certified that error appears in the above-identified patent and that said Letters Patent is hereby corrected as shown below:

In the specification:

col. 4, line 25 replace "Magnetic" with --magnetic--;

col. 9, line 22 replace "(API)" with --(AP1)--.

Signed and Sealed this

Eleventh Day of September, 2012

David J. Kappos
*Director of the United States Patent and Trademark Office*